(12) United States Patent
Hatori et al.

(10) Patent No.: US 9,397,061 B2
(45) Date of Patent: Jul. 19, 2016

(54) SEMICONDUCTOR DEVICE

(71) Applicant: SHINKO ELECTRIC INDUSTRIES CO., LTD., Nagano-ken (JP)

(72) Inventors: Yukinori Hatori, Nagano (JP); Takashi Ozawa, Nagano (JP)

(73) Assignee: Shinko Electric Industries Co., Ltd., Nagano-shi, Nagano-ken ( * ) Notice: Subject to any disclaimer, the term of this patent is extended or adjusted under 35 U.S.C. 154(b) by 0 days.

(21) Appl. No.: 14/591,209

(22) Filed: Jan. 7, 2015

(65) Prior Publication Data

US 2015/0200175 A1     Jul. 16, 2015

(30) Foreign Application Priority Data

Jan. 10, 2014 (JP) ................................. 2014-003530

(51) Int. Cl.
| | |
|---|---|
| H01L 23/00 | (2006.01) |
| H01L 23/31 | (2006.01) |
| H01L 25/065 | (2006.01) |
| H01L 25/075 | (2006.01) |
| H01L 25/04 | (2014.01) |
| H01L 21/56 | (2006.01) |

(52) U.S. Cl.
CPC .............. *H01L 24/16* (2013.01); *H01L 21/568* (2013.01); *H01L 23/3128* (2013.01); *H01L 25/043* (2013.01); *H01L 25/0657* (2013.01); *H01L 25/0756* (2013.01); *H01L 2224/16225* (2013.01); *H01L 2224/16227* (2013.01); *H01L 2924/12* (2013.01); *H01L 2924/12042* (2013.01); *H01L 2924/181* (2013.01)

(58) Field of Classification Search
CPC . H01L 24/16; H01L 23/3128; H01L 25/0657; H01L 25/0756; H01L 25/043
See application file for complete search history.

(56) References Cited

U.S. PATENT DOCUMENTS

| | | |
|---|---|---|
| 8,717,775 B1 | 5/2014 | Bolognia et al. |
| 2010/0097080 A1 | 4/2010 | Kobayashi et al. |
| 2010/0171207 A1 | 7/2010 | Shen et al. |
| 2012/0112764 A1 | 5/2012 | Goldenberg et al. |
| 2012/0299183 A1 | 11/2012 | Fujisawa |

(Continued)

FOREIGN PATENT DOCUMENTS

| | | |
|---|---|---|
| JP | 2001-223297 | 8/2001 |
| JP | 2003-007910 | 1/2003 |

OTHER PUBLICATIONS

European Search Report; EP 15 15 0271; Jun. 19, 2015; 8 pp.

*Primary Examiner* — Phat X Cao
(74) *Attorney, Agent, or Firm* — Fish & Richardson P.C.

(57) ABSTRACT

A semiconductor device includes a wiring layer formed on a first surface of a first insulation layer and including an external connection pad and an internal connection pad located at an inner side of the external connection pad. A semiconductor element facing the first surface of the first insulation layer includes an electrode pad located corresponding to the internal connection pad, a bump formed on the electrode pad and connected to the internal connection pad, and a circuit element region defined in a first surface of the semiconductor element at an inner side of the electrode pad. A second insulation layer fills a gap between the first surfaces of the semiconductor element and the first insulation layer. A third insulation layer covers a second surface of the semiconductor element and the second insulation layer and includes an opening that exposes the external connection pad connected to an external connection terminal.

8 Claims, 10 Drawing Sheets

(56) References Cited

U.S. PATENT DOCUMENTS

2013/0154108 A1* 6/2013 Lin ..................... H01L 23/5389
 257/774
2013/0221452 A1 8/2013 Strothmann et al.
2015/0108635 A1* 4/2015 Liang ..................... H01L 28/10
 257/737

* cited by examiner

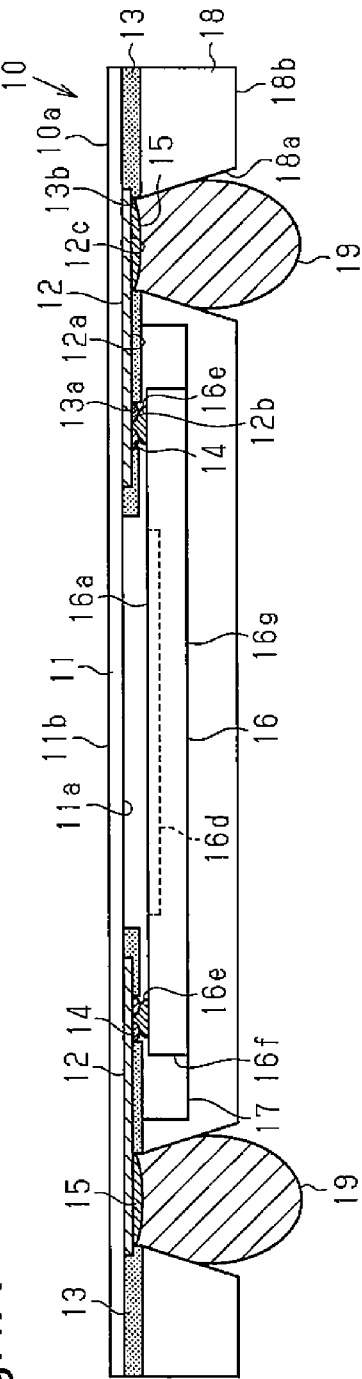
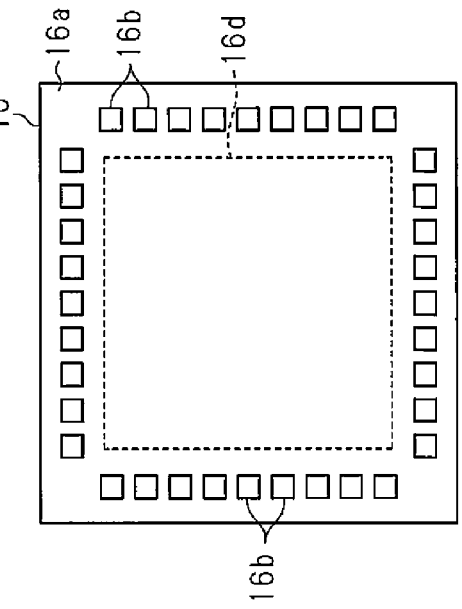
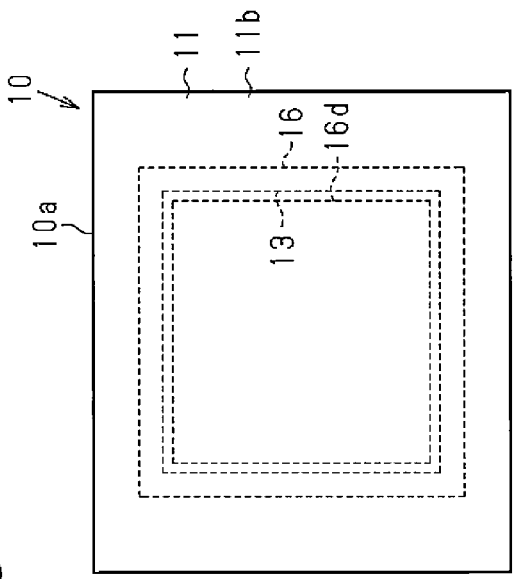

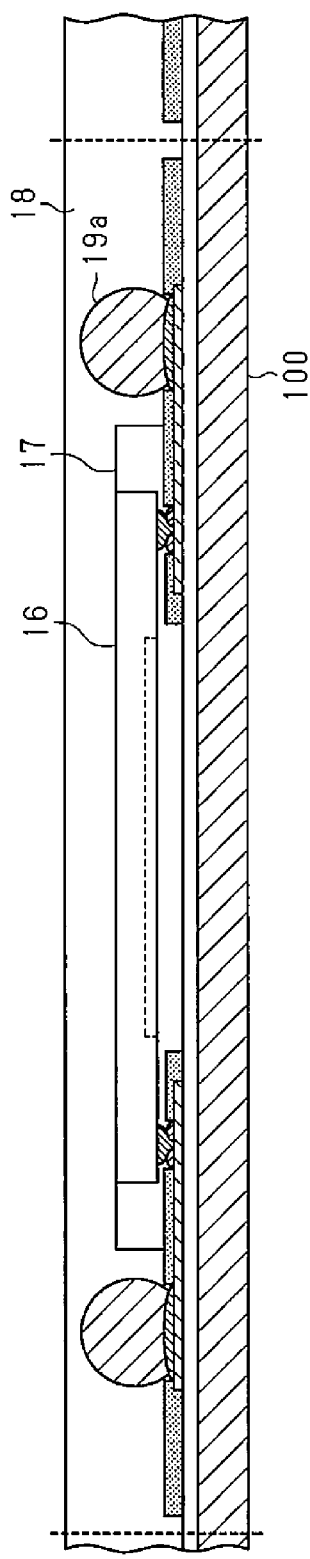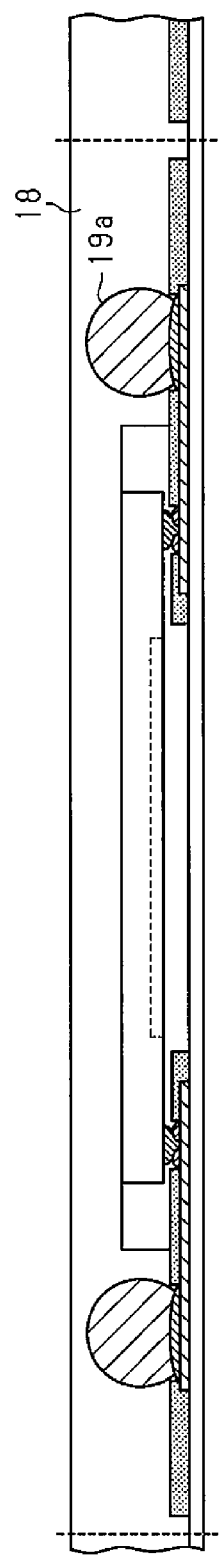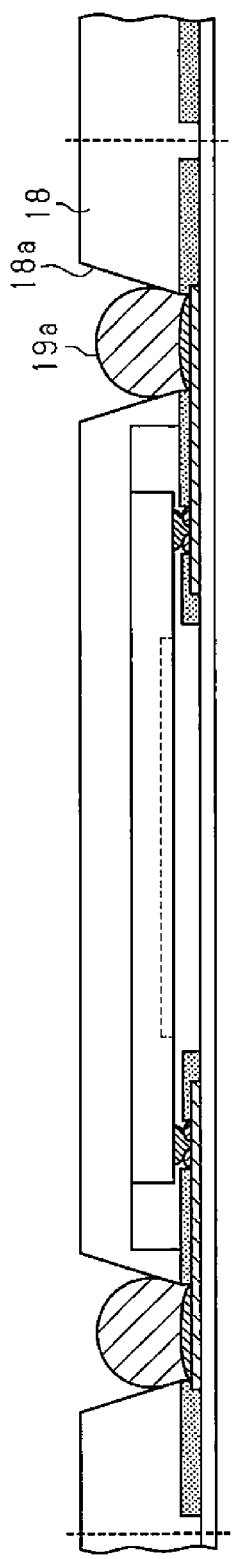

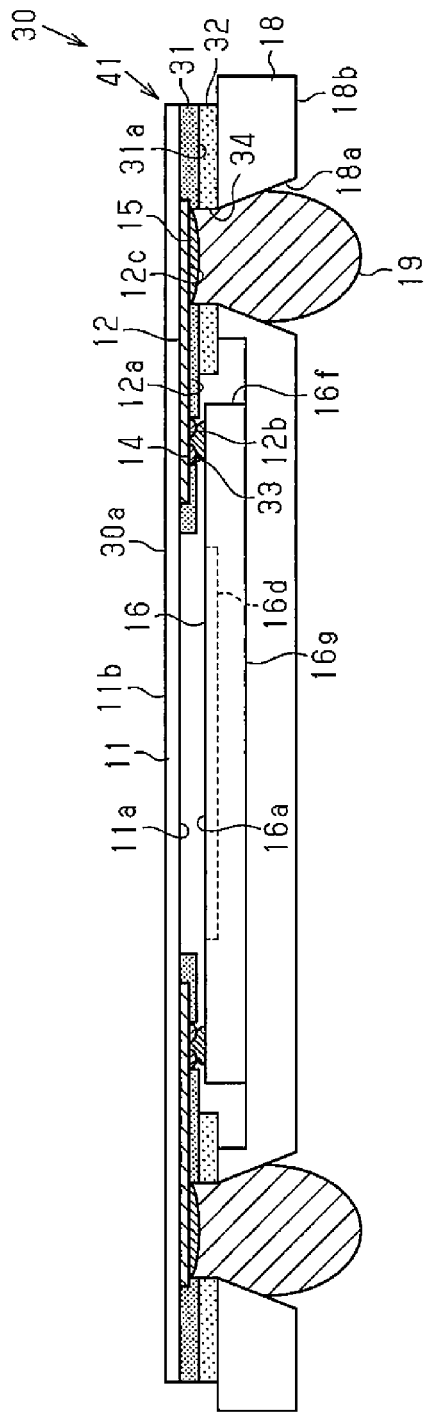
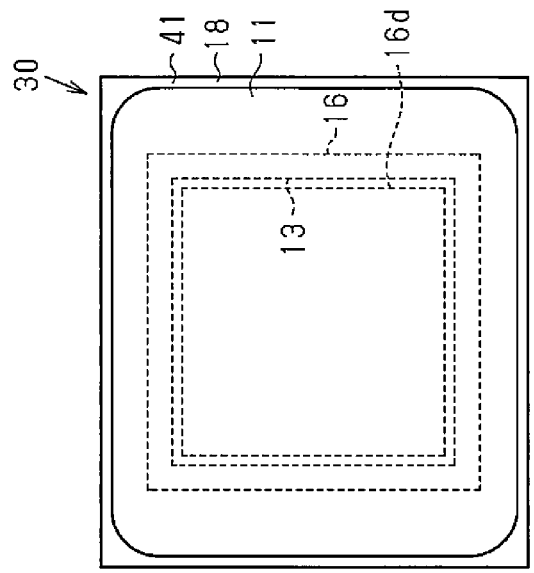
Fig.5A
Fig.5B

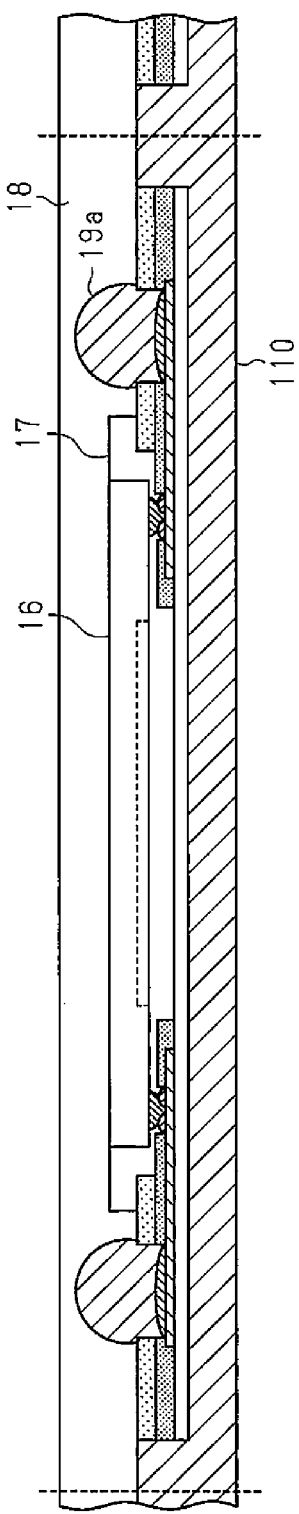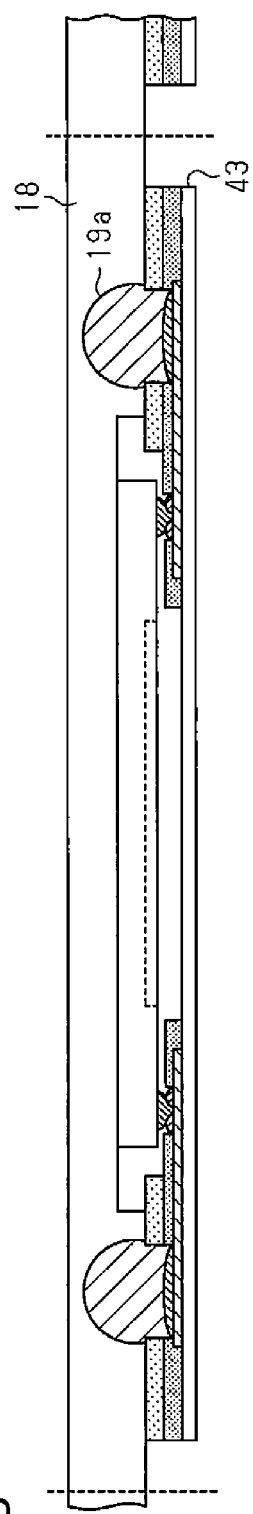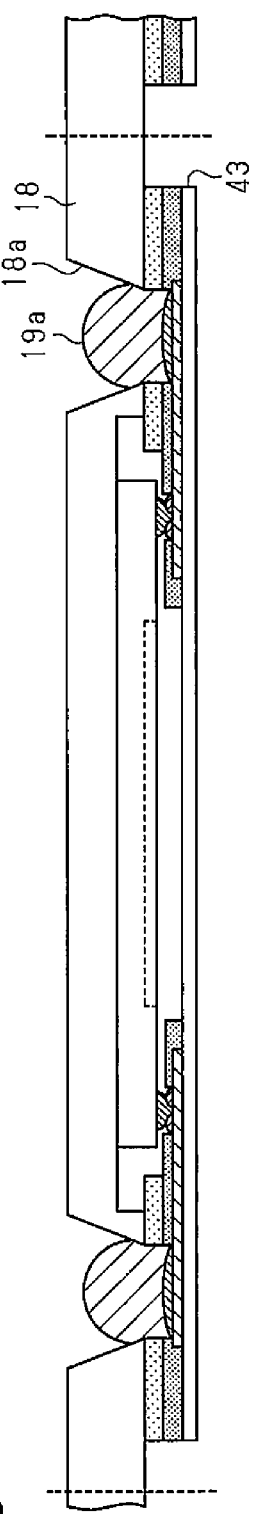

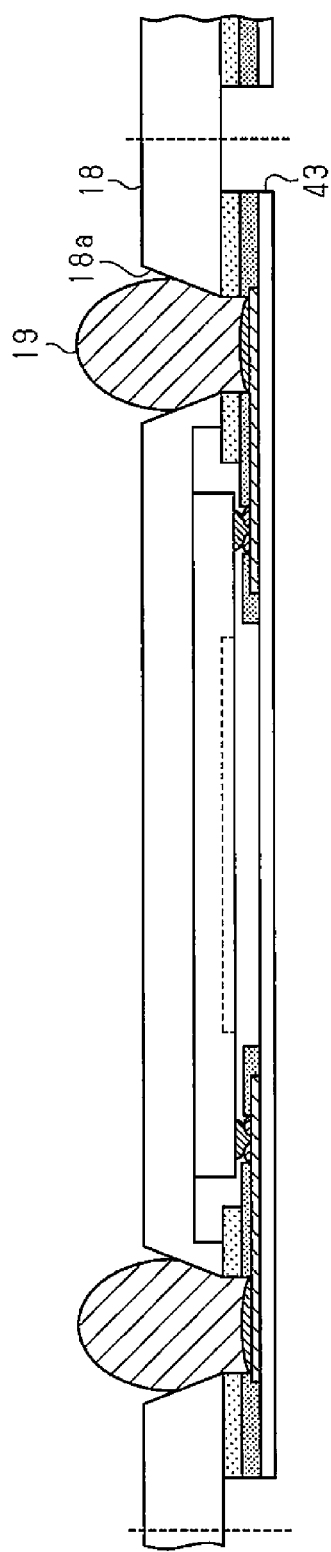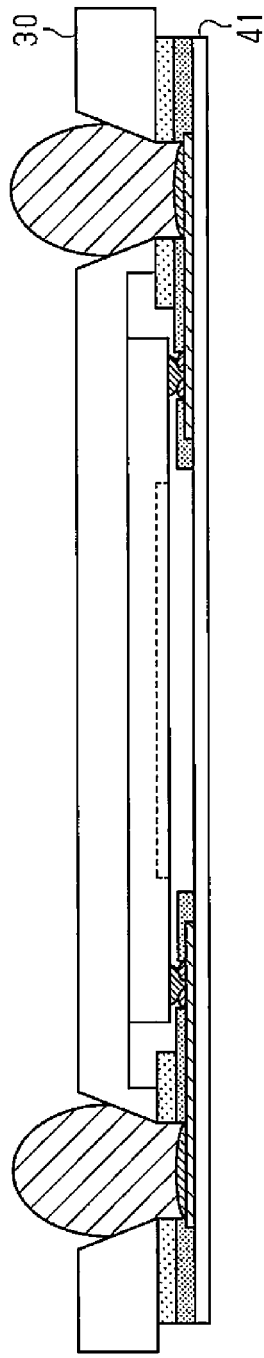

SEMICONDUCTOR DEVICE

CROSS-REFERENCE TO RELATED APPLICATIONS

This application is based upon and claims the benefit of priority from prior Japanese Patent Application No. 2014-003530, filed on Jan. 10, 2014, the entire contents of which are incorporated herein by reference.

FIELD

This disclosure relates to a semiconductor device and a method for manufacturing a semiconductor device.

BACKGROUND

Japanese Laid-Open Patent Publication Nos. 2001-223297 and 2003-7910 describe examples of a conventional semiconductor device (semiconductor package) that includes a semiconductor element (semiconductor chip). In a semiconductor device, a semiconductor element is mounted on a wiring substrate such as an interposer (rewiring substrate). For example, in face-up mounting, connection pads of a semiconductor element are connected to electrode pads of a wiring substrate by bonding wires such as a gold wire. Then, the semiconductor element and the bonding wires are encapsulated by a resin. In a face-down mounting (flip-chip mounting), connection pads of a semiconductor element are connected to electrode pads of a wiring substrate by bumps such as solder. Then, the semiconductor element is encapsulated by a resin.

SUMMARY

When a semiconductor element includes a circuit element that detects an approach of an object (detection subject), for example, a tactile sensor, the mounting condition of the semiconductor element may affect the operation of the semiconductor element. Thus, a semiconductor device that subtly affects the operation of the semiconductor element is needed.

In one aspect of this disclosure, a semiconductor device includes a first insulation layer and a wiring layer formed on a first surface of the first insulation layer. The wiring layer includes an external connection pad and an internal connection pad. The external connection pad is located at a position corresponding to a periphery of the first insulation layer. The internal connection pad is located at an inner side of the external connection pad. A semiconductor element is located facing the first surface of the first insulation layer. The semiconductor element includes an electrode pad formed on a first surface of the semiconductor element that faces the first surface of the first insulation layer and located at a position corresponding to the internal connection pad of the wiring layer. The semiconductor element further includes a bump formed on the electrode pad and connected to the internal connection pad. The semiconductor element further includes a circuit element region defined in the first surface of the semiconductor element at an inner side of the electrode pad. A second insulation layer fills a gap between the first surface of the semiconductor element and the first surface of the first insulation layer. A third insulation layer covers a second surface of the semiconductor element which is located at a side opposite to the first surface of the semiconductor element. The third insulation layer also covers the second insulation layer. The third insulation layer includes an opening at a position corresponding to the external connection pad. An external connection terminal is connected to the external connection pad.

According to this structure, the influence on the operation of a semiconductor element can be decreased.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 1A is a schematic cross-sectional view of a first embodiment of a semiconductor device;

FIG. 1B is a schematic plan view of the semiconductor device illustrated in FIG. 1A;

FIG. 1C is a schematic plan view of a semiconductor element illustrated in FIG. 1A;

FIGS. 2A to 2C, 3A to 3C, 4A, and 4B are schematic cross-sectional views illustrating the procedures for manufacturing the semiconductor device illustrated in FIG. 1A;

FIG. 5A is a schematic cross-sectional view of a second embodiment of the semiconductor device;

FIG. 5B is a schematic plan view of the semiconductor device illustrated in FIG. 5A;

FIGS. 6A to 6C, 7A to 7C, 8A, and 8B are the procedures for manufacturing the semiconductor device illustrated in FIG. 5A;

DESCRIPTION OF THE EMBODIMENTS

Figure 2A:
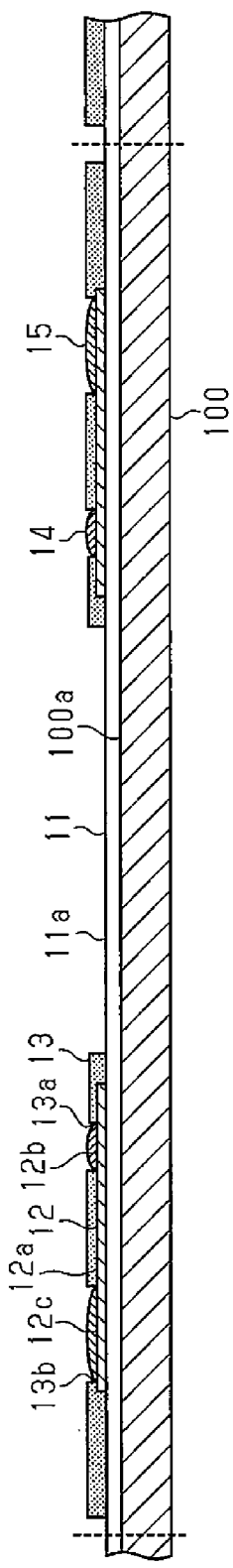

One embodiment will now be described with reference to the accompanying drawings. Elements in the drawings are illustrated for simplicity and clarity and have not necessarily been drawn to scale. In the cross-sectional views, hatching of some elements is omitted.

First Embodiment

As illustrated in FIG. 1A, a first embodiment of a semiconductor device 10 includes an insulation layer 11 at the outermost layer (uppermost layer in FIG. 1A).

As illustrated in FIG. 1B, the insulation layer 11 is tetragonal and flat. The thickness of the insulation layer 11 is, for example, 20 micrometers (μm). The material of the insulation layer 11 is, for example, an organic resin, such as an epoxy resin or a polyimide resin. Also, an insulative resin including a reinforcement material may be used as the material of the insulation layer 11. An insulative resin including a reinforcement material is formed, for example, by impregnating a thermosetting resin, such as epoxy or polyimide, in a reinforcement material, such as a woven cloth or a non-woven cloth using a fiber bundle, such as glass, aramid, or liquid crystal polymer (LCP).

As illustrated in FIG. 1A, the insulation layer 11 includes a first surface (lower surface 11a in FIG. 1A) and a second surface (upper surface 11b in FIG. 1A). The upper surface 11b of the insulation layer 11 forms the outermost surface (upper surface 10a in FIG. 1A) of the semiconductor device 10. A wiring layer 12 is formed on the lower surface 11a of the insulation layer 11. The wiring layer 12 is formed on a peripheral region of the insulation layer 11. The region where the wiring layer 12 is formed is set in correspondence with a semiconductor element 16. The material of the wiring layer 12 is, for example, copper (Cu).

The wiring layer 12 includes a first surface (lower surface 12a in FIG. 1A) and a second surface (upper surface in FIG. 1A). The upper surface of the wiring layer 12 is covered by the insulation layer 11. The lower surface 12a of the wiring layer 12 is covered by a resist layer 13. The material of the resist layer 13 is, for example, an organic resin, such as an epoxy resin or a polyimide resin. The resist layer 13 includes openings 13a and 13b that partially expose the lower surface 12a of the wiring layer 12. The opening 13a exposes an inner portion of the lower surface 12a of the wiring layer 12 as an internal connection pad 12b. The opening 13b exposes an outer portion of the lower surface 12a of the wiring layer 12 as an external connection pad 12c. Surfaces of the connection pads 12b and 12c may be covered by a plating layer (not illustrated). In this case, a plate layer is formed, for example, from tin (Sn) or by undergoing an electroless plating process.

A bump 14 is formed on the internal connection pad 12b. The bump 14 is, for example, solder. A bump 15 is formed on the external connection pad 12c. The bump 15 is, for example, solder. The material of a solder bump is, for example, an alloy of Sn and Cu, an alloy of Sn and silver (Ag), or an alloy of Sn, Ag, and Cu, or the like. The bump 15 may be omitted.

The semiconductor element 16 (semiconductor chip) is connected to the internal connection pads 12b. The semiconductor element 16 includes a first surface (upper surface 16a in FIG. 1A) and a second surface (lower surface 16g in FIG. 1A). The semiconductor element 16 is, for example, a sensor chip that detects the capacitance of an object (detection subject) proximate to the upper surface 16a of the semiconductor element 16. An example of a detection subject is a human finger. The thickness of the semiconductor element 16 is, for example, 200 μm.

As illustrated in FIG. 1C, a plurality of the external connection pads 16b (electrode pads) are formed in the peripheral region of the upper surface 16a of the semiconductor element 16. The external connection pad 16b is, for example, tetragonal in a plan view.

A detection region 16d, which serves as a circuit element region, is formed on the upper surface 16a of the semiconductor element 16, for example, at an inner side of the external connection pad 16b. In the present embodiment, a circuit element (sensor element) used to detect an object is formed in the detection region 16d. As illustrated in FIG. 1C, the detection region 16d is, for example, tetragonal in a plan view. Although formed on the upper surface 16a of the semiconductor element 16, the detection region 16d extends in the thicknesswise direction of the semiconductor element 16 as illustrated by broken lines in FIG. 1A. This is the same in the other accompanying drawings.

As illustrated in FIG. 1A, a bump 16e is formed on the external connection pad 16b (refer to FIG. 1C). The bump 16e is, for example, gold. The semiconductor element 16 is electrically connected to the wiring layer 12 by the bumps 16e and 14.

As described above, the wiring layer 12 is formed in the region corresponding to the semiconductor element 16 and covered by the resist layer 13. The wiring layer 12 is formed so as not to be overlapped with the detection region 16d of the upper surface 16a of the semiconductor element 16 in a plan view. Although the wiring layer 12 is not illustrated in FIG. 1B, the wiring layer 12 is located in a region between outer edges of the detection region 16d and the insulation layer 11, more specifically, between an inner edge of the resist layer 13 and the outer edge of the insulation layer 11. Thus, the external connection pad 12c is located in a region where the external connection pad 12c is not overlapped with the semiconductor element 16 in a plan view, that is, the outer side of the semiconductor element 16.

As illustrated in FIG. 1A, a gap formed by the upper surface 16a of the semiconductor element 16, the lower surface 11a of the insulation layer 11, and the resist layer 13, is filled with an underfill resin 17. The underfill resin 17 is, for example, an insulative resin such as an epoxy resin. The underfill resin 17 also substantially covers a side surface 16f of the semiconductor element 16.

The lower surface 16g of the semiconductor element 16 is covered by an insulation layer 18. The insulation layer 18 also covers the underfill resin 17 and the resist layer 13. That is, the semiconductor element 16 is encapsulated by the insulation layer 18. The insulation layer 18 is, for example, an insulative resin such as an epoxy resin. The insulation layer 18 is a mold resin that is formed by a transfer molding process, a compression molding process, an injection molding process, or the like. The thickness of the insulation layer 18 is, for example, approximately 200 μm, at a location where the insulation layer 18 covers the lower surface 16g of the semiconductor element 16.

The insulation layer 18 includes an opening 18a that exposes the bump 15. An external connection terminal 19 is formed in the opening 18a. The external connection terminal 19 is, for example, a solder ball. The material of a solder ball is, for example, an alloy of Sn and Cu, an alloy of Sn and Ag, an alloy of Sn, Ag, and Cu, or the like. The external connection terminal 19A includes a distal end (lower end in FIG. 1A) projecting beyond the lower surface 18b of the insulation layer 18. The external connection terminal 19 is used to connect a pad of a mount board (e.g., motherboard) on which the semiconductor device 10 is mounted. The external connection terminal 19 ensures a distance ("standoff") between the lower surface (here, lower surface 18b) of the semiconductor device 10 and a mounting surface of the mount board which face toward each other.

The operation of the semiconductor device 10 will now be described.

The wiring layer 12 is not formed immediately above the detection region 16d of the semiconductor element 16. The detection region 16d is covered by the underfill resin 17, which fills a gap between the lower surface 11a of the insulation layer 11 and the upper surface 16a of the semiconductor element 16. In other words, the detection region 16d is covered by the underfill resin 17 and the insulation layer 11. The thickness of the underfill resin 17 is determined by the thickness of the wiring layer 12 and the shapes of the bumps 16e and 14, which connect the semiconductor element 16 to the wiring layer 12. In this manner, the detection region 16d is not covered by an encapsulation resin, which is used in various types of molding processes. Thus, compared to when an encapsulation resin is used, the insulation layer 11 and the underfill resin 17, which cover the detection region 16d, are thin, and thickness variations of the insulation layer 11 and the underfill resin 17 resulting from a manufacturing process are small.

This results in small variations resulting from the manufacturing process in the distance between the upper surface 16a of the semiconductor element 16, which includes the detection region 16d, and the upper surface 11b of the insulation layer 11 (upper surface 10a of the semiconductor device 10) arranged as a contact surface of a detection subject. Thus, the insulation layer 11 and the underfill resin 17, which cover the upper surface 16a of the semiconductor element 16, subtly affect a detecting operation of the semiconductor element 16.

When the semiconductor element 16 is a chip sensor that includes a sensor element, for example, a tactile sensor, in the circuit element region (detection region 16d), face-down mounting in which the detection region 16d and the mount board face toward each other is not used.

Figure 10:
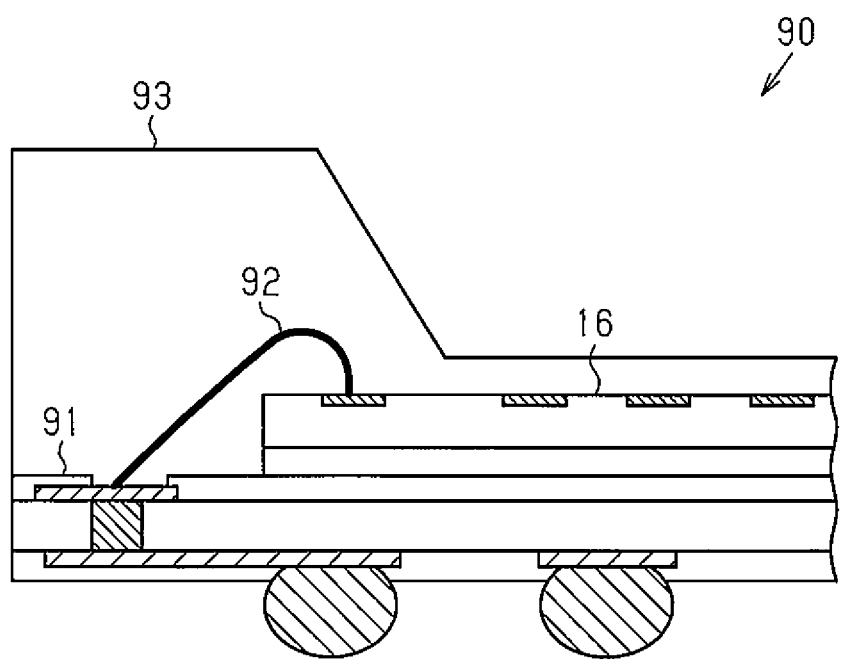
FIG. 10 is a schematic cross-sectional view of a comparative example of a semiconductor element.

Thus, as illustrated in FIG. 10, the semiconductor element 16, which is a chip sensor, is face-up-mounted. In this case, in a semiconductor device 90, which is of a conventional type and includes the semiconductor element 16, the semiconductor element 16 is connected to a wiring substrate 91 by a bonding wire 92. The bonding wire 92 is covered by, for example, a molded resin 93. However, the molded resin 93 may cause variations in the thickness depending on the conditions of the manufacturing process. The variations in the thickness of the resin 93 affect the operation (e.g., detection sensitivity, detection precision, or the like) of the semiconductor element 16.

In contrast, the semiconductor device 10 of the present embodiment has small variations in the distance between the upper surface 16a of the semiconductor element 16, which includes detection region 16d, and the upper surface 11b of the insulation layer 11 (upper surface 10a of the semiconductor device 10) during the manufacturing process. Thus, in the semiconductor device 10, the insulation layer 11 and the underfill resin 17, which cover the upper surface 16a of the semiconductor element 16 subtly affects the detecting operation of the semiconductor element 16.

The procedures for manufacturing the semiconductor device 10 will now be described with reference to FIGS. 2A to 4B. FIGS. 2A to 4B only have those reference characters that are used in the description of the steps.

The procedures for forming the structure illustrated in FIG. 2A will now be described. As illustrated in FIG. 2A, a support plate 100 is prepared. The support plate 100 is flat. The material of the support plate 100 is, for example, copper (Cu). The thickness of the support plate 100 is, for example, 0.1 to 0.2 mm. For example, the support plate 100 is large enough to simultaneously form a batch of the semiconductor elements 16.

A film-like insulative resin is applied to an upper surface 100a of the support plate 100 to form the insulation layer 11. The first surface 11a (upper surface in FIG. 2A) of the insulation layer 11 undergoes, for example, an additive process, a semi-additive process, or the like, to form the wiring layer 12. Alternatively, the insulation layer 11 and the wiring layer 12 may be formed by using a lamination film of the insulation layer 11 and a metal layer. In such a case, the lamination film is applied so that the insulation layer 11 faces the upper surface 100a of the support plate 100. The metal layer is etched to form the wiring layer 12. The wiring layer 12 is covered by, for example, a photosensitive resin film, and the resin film is patterned by a photolithography. This forms the resist layer 13 that includes the openings 13a and 13b. A conductive material (e.g., solder paste) is applied to the first surface 12a (upper surface in FIG. 2A) of the wiring layer 12 through the openings 13a and 13b. The conductive material undergoes a reflow process to form the bumps 14 and 15.

Figure 2B:
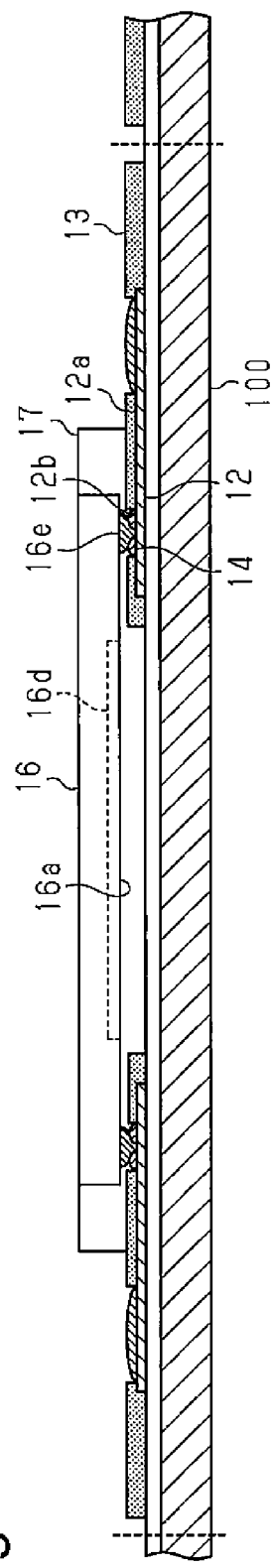

The procedures for forming the structure illustrated in FIG. 2B will now be described. The semiconductor element 16 is prepared. The first surface 16a (lower surface in FIG. 2B) of the semiconductor element 16 includes the bump 16e.

A resin film is applied to cover the internal connection pads 12b of the wiring layer 12. The resin film is partially cured. In a state in which the first surface 16a of the semiconductor element 16 faces an upper surface of the resin film, the semiconductor element 16 is pressed to the resin film by applying pressure in a high temperature (thermal pressure bonding). This connects the bump 16e of the semiconductor element 16 to the bump 14 of the first surface 12a (upper surface in FIG. 2B) of the wiring layer 12. The force produced by a distal end of the bump 16e contacting the first surface 12a of the wiring layer 12 is used to press the semiconductor element 16. This accurately sets the distance between the first surface 16a of the semiconductor element 16 and the first surface 12a of the wiring layer 12. The resin film, which has been softened by the thermal pressure bonding, is hardened to form the underfill resin 17. Then, the underfill resin 17 is completely hardened by curing (thermosetting process).

Figure 2C:
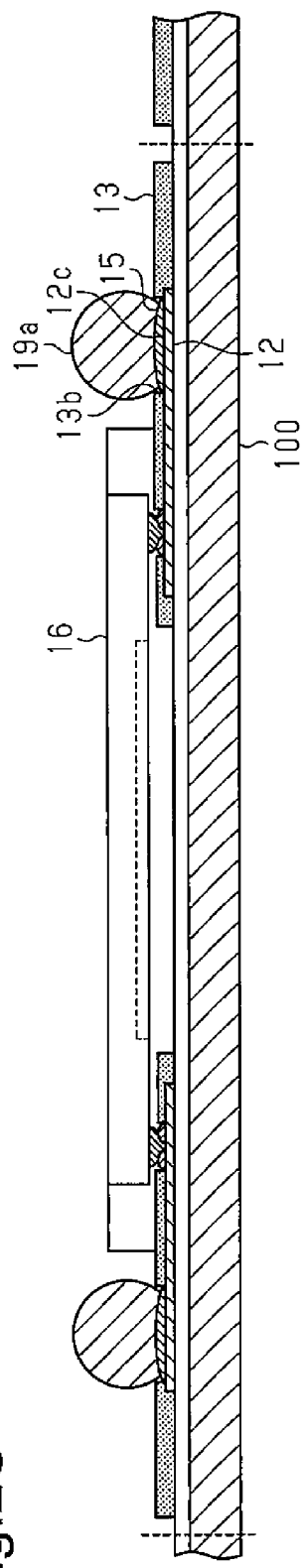

As illustrated in FIG. 2C, a solder bump 19a is formed on the external connection pad 12c. The solder bump 19a is obtained by, for example, mounting a spherical solder ball on the external connection pad 12c and performing a reflow process on the solder ball.

As illustrated in FIG. 3A, an upper surface of the structure illustrated in FIG. 2C is entirely encapsulated (molded) by a resin. For example, the structure of FIG. 2C undergoes a transfer molding process, a compression molding process, an injection molding process, or the like. This forms the insulation layer 18 that covers the semiconductor element 16, the underfill resin 17, and the solder bump 19a.

As illustrated in FIG. 3B, the support plate 100 is removed. For example, when the support plate 100 is formed from copper, the support plate 100 is removed by etching.

As illustrated in FIG. 3C, the opening 18a is formed in the insulation layer 18 to expose the solder bump 19a. For example, a laser processing device is used to form the opening 18a.

Figure 4A:
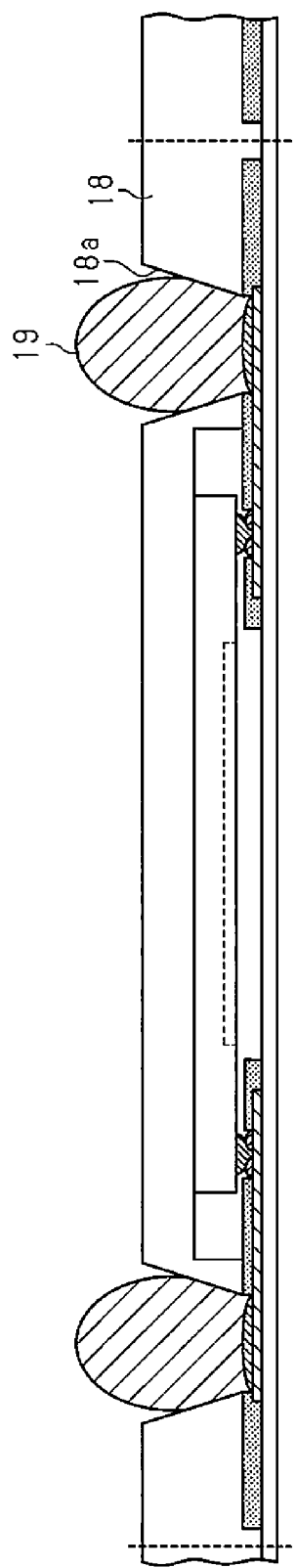

As illustrated in FIG. 4A, the external connection terminal 19 is formed. The external connection terminal 19 is obtained by applying a conductive material, such as a solder paste or a solder ball, to the solder bump 19a illustrated in FIG. 3C and performing a reflow process on the conductive material.

Figure 4B:
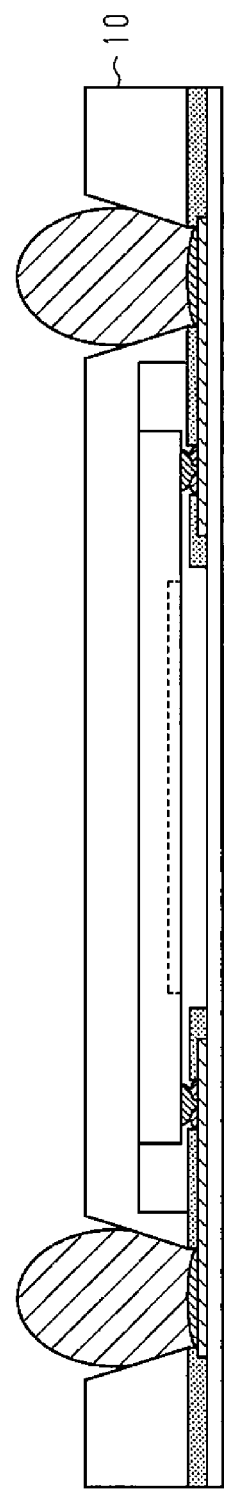

As illustrated in FIG. 4B, the structure of FIG. 4A is cut along predetermined positions (broken lines illustrated in FIG. 4B) to obtain an individual piece of the semiconductor device 10. For the sake of the illustration of manufacturing procedures, the structure of FIG. 1A is reversed upside-down in FIGS. 2A to 4B.

The first embodiment has the advantages described below.

(1-1) The semiconductor device 10 includes the insulation layer 11 at the uppermost position. The wiring layer 12 is formed on the lower surface 11a (first surface) of the insulation layer 11. The lower surface 12a (first surface) of the wiring layer 12 is covered by the resist layer 13. The resist layer 13 includes the openings 13a and 13b, which partially expose the lower surface 12a of the wiring layer 12. The opening 13a exposes the inner portion of the lower surface 12a of the wiring layer 12 as the internal connection pad 12b. The opening 13b exposes the outer portion of the lower surface 12a of the wiring layer 12 as the external connection pad 12c. The internal connection pads 12b are connected to the semiconductor element 16.

The detection region 16d is formed on the upper surface 16a (first surface) of the semiconductor element 16. The upper surface 16a of the semiconductor element 16 is covered by the insulation layer 11 and the underfill resin 17. The semiconductor element 16 is electrically connected to the wiring layer 12 formed on the lower surface 11a of the insulation layer 11 by bonding the bump 16e to the bump 14. The wiring layer 12 includes the external connection pads 12c at the outer side of the internal connection pads 12b, which are connected to the semiconductor element 16. The semiconductor device 10 is mounted on the external connection pads 12c.

This results in small variations resulting from the manufacturing process in the distance between the upper surface 16a of the semiconductor element 16, which includes the detection region 16d, and the upper surface 11b (second surface) of the insulation layer 11 arranged as the contact surface of a detection subject. Thus, the insulation layer 11 and the underfill resin 17, which cover the upper surface 16a of the semiconductor element 16, subtly affect the detecting operation of the semiconductor element 16.

(1-2) The insulation layer 11 is formed on the upper surface 100a of the support plate 100. The wiring layer 12 is formed on the first surface 11a of the insulation layer 11. Then, the semiconductor element 16 is connected to the internal connection pads 12b of the wiring layer 12. The semiconductor element 16 is covered by the insulation layer 18. The support plate 100 is removed. The opening 18a is formed in the insulation layer 18. The external connection terminal 19 is formed in the opening 18a. This allows for easy formation of the semiconductor device 10 in which the thin insulation layer 11 and the thin underfill resin 17 cover the first surface 16a of the semiconductor element 16, which includes the circuit element region (detection region 16d).

Second Embodiment

A second embodiment will now be described. In the second embodiment, the same reference characters are given to those components that are the same as the corresponding components of the first embodiment. The description of such components will be omitted partially or entirely.

As illustrated in FIG. 5A, a semiconductor device 30 includes the insulation layer 11 at the uppermost position. The wiring layer 12 is formed on the lower surface 11a (first surface) of the insulation layer 11. The lower surface 12a (first surface) of the wiring layer 12 is covered by a first resist layer 31. The material of the first resist layer 31 is, for example, an organic resin, such as an epoxy resin or a polyimide resin. A second resist layer 32 is formed on a lower surface 31a (first surface) of the first resist layer 31. The second resist layer 32 covers a peripheral portion of the lower surface 31a of the first resist layer 31. The first resist layer 31 includes an opening 33. The opening 33 exposes an inner portion of the lower surface 12a of the wiring layer 12 as the internal connection pad 12b. An opening 34 is formed in the first and second resist layers 31 and 32. The opening 34 exposes an outer portion of the lower surface 12a of the wiring layer 12 as the external connection pad 12c. In the same manner as the first resist layer 31, the material of the second resist layer 32 is, for example, an organic resin, such as an epoxy resin or a polyimide resin. The first and second resist layers 31 and 32 may be formed from different materials.

The outer edge of the insulation layer 11 and the outer edges of the first and second resist layers 31 and 32 are located at an inner side of the outer edge of the insulation layer 18. For example, as illustrated in FIG. 5B, the insulation layer 11 has a tetragonal shape that is smaller than the insulation layer 18, and corners of the insulation layer 11 are rounded in a plan view. Thus, the semiconductor device 30 includes a step 41 at the outer edge. The step 41 allows for easy coupling (e.g., alignment) of the semiconductor device 30 to an electronic device. Also, the step 41 is arranged to determine the attachment position of the semiconductor device 30 in an electronic device, for example, the position of an upper surface 30a of the semiconductor device 30 relative to a surface of the electronic device.

The procedures for manufacturing the semiconductor device 30 will now be described.

Figure 6A:
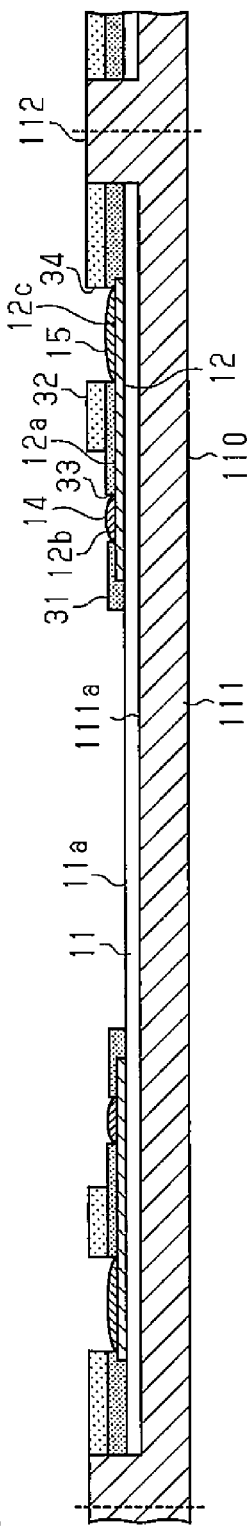

The procedures for forming the structure illustrated in FIG. 6A will now be described. As illustrated in FIG. 6A, a support plate 110 is prepared. The support plate 110 includes a flat support portion 111 and a projection portion 112 projecting upward from a first surface 111a (upper surface in FIG. 6A) of the support portion 111. The projection portion 112 has the shape of a lattice that corresponds to the position of the step 41 of the semiconductor device 30 illustrated in FIG. 5B. A film-like insulative resin is applied to the first surface 111a of the support portion 111 to form the insulation layer 11. The first surface 111a of the support portion 111 undergoes, for example, an additive process, a semi-additive process, or the like, to form the wiring layer 12. In the same manner as FIG. 2A, the insulation layer 11 and the wiring layer 12 may be formed by applying a lamination film of the insulation layer 11 and a metal layer to the support portion 111 and etching the metal layer.

The wiring layer 12 is covered by, for example, a photosensitive resin film, and the resin film is patterned by a photolithography. This forms the first resist layer 31 that includes the opening 33. In the same manner, the first resist layer 31 is covered by, for example, a photosensitive resin film, and the resin film is patterned by a photolithography. This forms the second resist layer 32 that includes the opening 34. A conductive material (e.g., solder paste) is applied to the first surface 12a of the wiring layer 12 through the openings 33 and 34. The conductive material undergoes a reflow process to form the bumps 14 and 15.

Figure 6B:
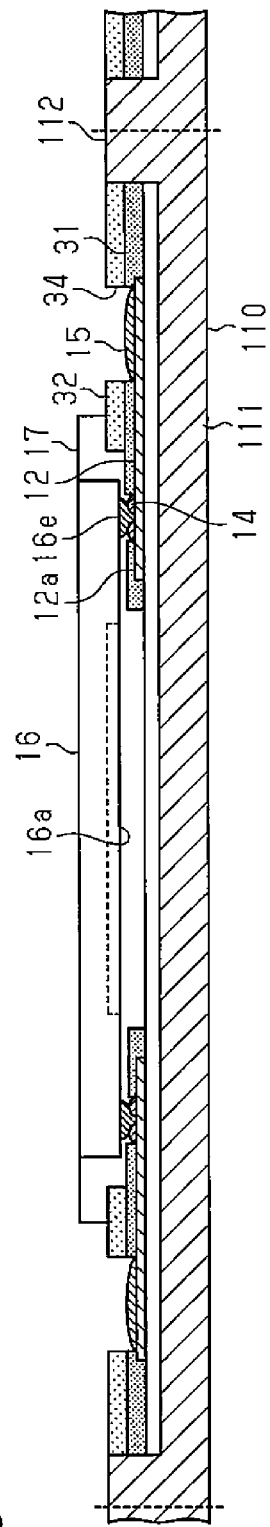

The procedures for forming the structure illustrated in FIG. 6B will now be described. A resin film is applied to cover the internal connection pads 12b of the wiring layer 12. The resin film is partially cured. In a state in which the first surface 16a of the semiconductor element 16 faces an upper surface of the resin film, the semiconductor element 16 is pressed to the resin film by applying pressure in a high temperature (thermal pressure bonding). This connects the bump 16e of the first surface 12a of the wiring layer 12 to the bump 14 of the semiconductor element 16. The resin film, which has been softened by the thermal pressure bonding, is hardened to form the underfill resin 17. Then, the underfill resin 17 is completely hardened by curing (thermosetting process).

Figure 6C:
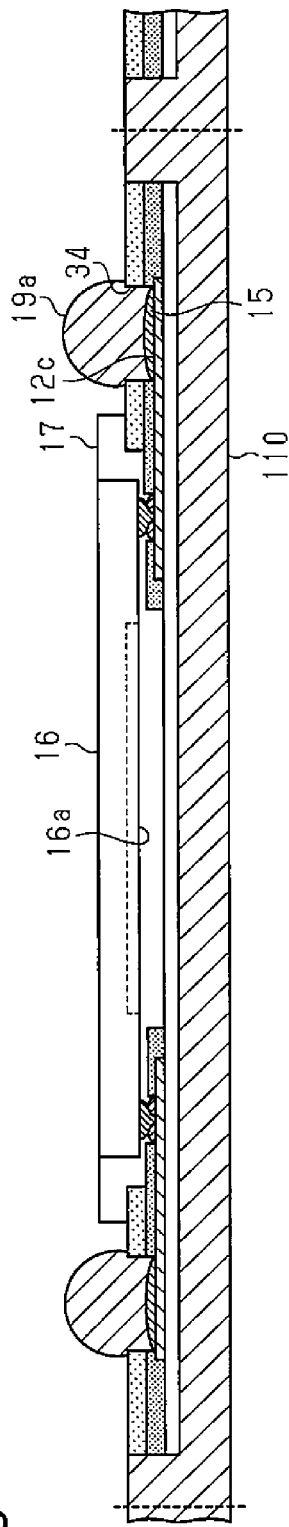

As illustrated in FIG. 6C, the solder bump 19a is formed on the external connection pad 12c. The solder bump 19a is obtained by, for example, mounting a spherical solder ball on the external connection pad 12c and performing a reflow process on the solder ball.

As illustrated in FIG. 7A, an upper surface of the structure illustrated in FIG. 6C is entirely encapsulated (molded) by a resin. For example, the structure of FIG. 6C undergoes a transfer molding process, a compression molding process, an injection molding process, or the like. This forms the insulation layer 18 that covers the semiconductor element 16, the underfill resin 17, and the solder bump 19a.

As illustrated in FIG. 7B, the support plate 110 is removed. For example, when the support plate 110 is formed from copper, the support plate 110 is removed by etching. A groove portion 43 (recessed portion) having the shape of a lattice is formed by removing the support plate 110.

As illustrated in FIG. 7C, the opening 18a is formed in the insulation layer 18 to expose the solder bump 19a. For example, a laser processing device is used to form the opening 18a.

As illustrated in FIG. 8A, the external connection terminal 19 is formed. The external connection terminal 19 is obtained by applying a conductive material, such as a solder paste or a solder ball, to the solder bump 19a illustrated in FIG. 7C and performing a reflow process on the conductive material.

As illustrated in FIG. 8B, the structure of FIG. 8A is cut along predetermined positions (broken lines illustrated in FIG. 8B) of the groove portion 43 to obtain an individual piece of the semiconductor device 30. The semiconductor device 30 includes the step 41. For the sake of the illustration of manufacturing steps, the structure of FIG. 5A is reversed upside-down in FIGS. 6A to 8B.

The second embodiment has the following advantages in addition to the advantages of the first embodiment.

(2-1) The semiconductor device 30 includes the insulation layer 11 at the uppermost position. The wiring layer 12 is formed on the lower surface 11a (first surface) of the insulation layer 11. The lower surface 12a (first surface) of the wiring layer 12 is covered by the first resist layer 31. The peripheral portion of the first resist layer 31 is covered by the second resist layer 32. The outer edge of the insulation layer 11 and the outer edges of the first and second resist layers 31 and 32 are located at the inner side of the outer edge of the insulation layer 18. The insulation layer 11 has the tetragonal shape that is smaller than the insulation layer 18, and the edges are chamfered to have an arcuate shape in a plan view. Thus, the semiconductor device 30 includes the step 41 at the outer edge. This provides the semiconductor device 30 including the step 41 that corresponds to the thickness of the insulation layer 11 and the thicknesses of the first and second resist layers 31 and 32.

(2-2) The support plate 110 includes the flat support portion 111 and the projection portion 112, which has the shape of a lattice and projects from the support portion 111. The insulation layer 11 is formed on the support portion 111. The wiring layer 12 is formed on the first surface 11a of the insulation layer 11. The semiconductor element 16 is connected to the internal connection pads 12b of the wiring layer 12. The semiconductor element 16 is covered by the insulation layer 18. The support plate 110 is removed. The removal of the support portion 111 forms the groove portion 43 that corresponds to the projection portion 112. Then, the opening 18a is formed in the insulation layer 18. The external connection terminal 19 is formed in the opening 18a. This allows for easy formation of the semiconductor device 30 in which the thin insulation layer 11 and the thin underfill resin 17 cover the first surface 16a of the semiconductor element 16, which includes the circuit element region (detection region 16d). Also, the semiconductor device 30 includes the step 41. This allows for easy coupling of the semiconductor device 30 to an electronic device.

It should be apparent to those skilled in the art that the present invention may be embodied in many other specific forms without departing from the scope of the invention. Particularly, it should be understood that the present invention may be embodied in the following forms.

In the second embodiment, the shape of the step 41 of the semiconductor device 30 may be modified.

Figure 9A:
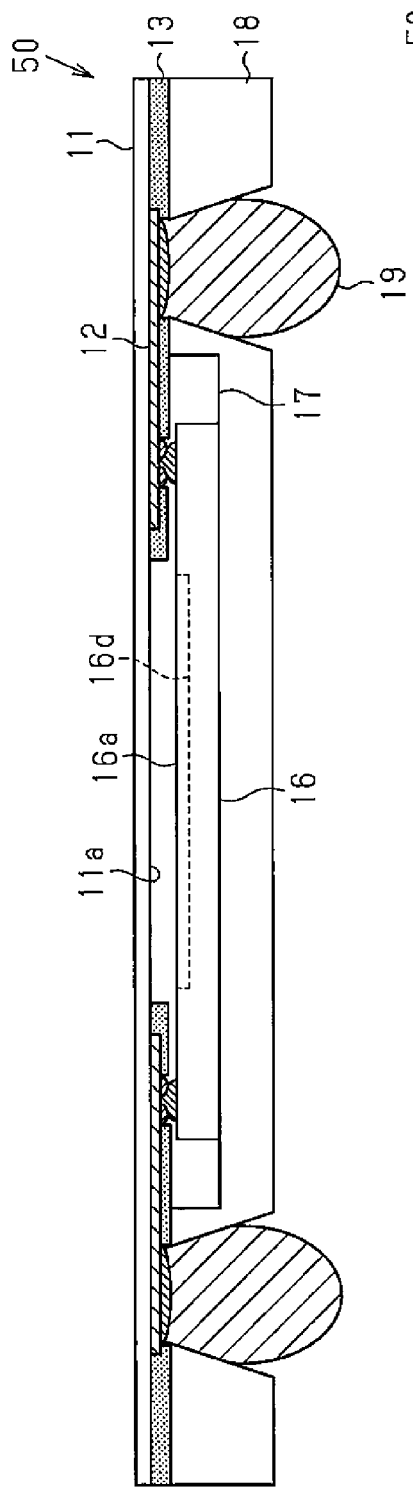
FIG. 9A is a schematic cross-sectional view of another semiconductor device.
Figure 9B:
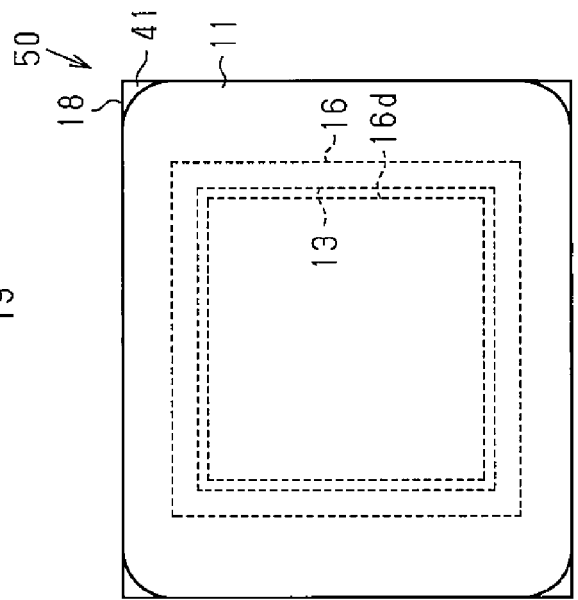
FIG. 9B is a schematic plan view of the semiconductor device illustrated in FIG. 9A.

For example, as illustrated in FIG. 9B, a step 41 may be formed only on corners of a semiconductor device 50. In the same manner as the semiconductor device 10 of the first embodiment, as illustrated in FIG. 9A, the semiconductor device 50 includes the single resist layer 13 formed on the first surface 11a of the insulation layer 11. Instead, the semiconductor device 50 may include the first and second resist layers 31 and 32 in the same manner as the second embodiment.

The shape of the step 41 may be modified. For example, the step 41 may be formed by cutting away corners of the insulation layer 11 in a straight line. For example, in the second embodiment, the step 41 may be formed by forming the octagonal insulation layer 11 in a plan view.

In the second embodiment, the step 41 is formed by the insulation layer 11 and the first and second resist layers 31 and 32. However, the shape of the step may be modified. The step only needs to be formed to partially include the insulation layer 18. For example, the upper surface of the insulation layer 18 may be covered by another resist layer. Alternatively, the height of the projection portion 112 illustrated in FIG. 6A may be changed during the process for manufacturing the semiconductor device 30 to change the film thicknesses of the first and second resist layers 31 and 32. This changes the height of the step 41 formed by the projection portion 112.

The shape of the detection region 16d illustrated in FIG. 1C is one example and thus may be modified, for example, to be circular in a plan view. Alternatively, a plurality of detection regions may be formed on the upper surface 16a of the semiconductor element 16.

In the above embodiments, the support plates 100 and 110 formed from copper are removed by etching. However, a material other than copper may be used as long as the support plates 100 and 110 can be removed. For example, a rigid holding material may be used. The rigid holding material may be removed during the process. Also, peripheral portions of the copper support plates 100 and 110 may be bonded to the insulation layer 11, for example, with an adhesive agent. The support plates 100 and 110 are removed by separating the bonding portion.

In FIG. 1C, the external connection pads 16b are arranged in a tetragonal layout along the periphery of the semiconductor element 16. However, the external connection pads 16b are not limited to such a layout. For example, the external connection pads 16b may be located along two opposing sides of the semiconductor element 16. Alternatively, the external connection pads 16b may be arranged in a plurality of rows (e.g., two rows) along the side of the semiconductor element 16.

The step 41 may be formed by mechanically processing the insulation layer 11, the resist layer, and the like using a routing machine, or the like.

In the second embodiment, a plurality of second resist layers may be stacked. The step 41 may be formed by partially or entirely using the second resist layers.

For example, the bumps 14 and 15 illustrated in FIG. 1A may be omitted from the above embodiments.

In the above embodiments, the external connection terminal 19 illustrated in FIG. 1A does not have to be projected beyond the lower surface 18b of the insulation layer 18 in accordance with the mounted semiconductor devices 10 and 30. In this case, the step illustrated in FIG. 4A (step to form the external connection terminal 19 applying a conductive material to the bump 19a) may be omitted.

In the above embodiments, the shape of the resist layers 13 and 31 may be modified. For example, in the first embodiment, as illustrated in FIGS. 1A and 1B, the resist layer 13 covers the lower surface 11a (first surface) of the insulation layer 11 at the outer side of the detection region 16d of the semiconductor element 16. Instead, the resist layer 13 may be formed to be partially overlapped with the detection region 16d or to entirely cover the lower surface 11a of the insulation layer 11 in a plan view.

Clauses

This disclosure further encompasses various embodiments described below.

1. A method for manufacturing a semiconductor device, the method including:

forming an insulation layer on an upper surface of a support plate;

forming a wiring layer on an upper surface of the insulation layer;

connecting a semiconductor element to an internal connection pad of the wiring layer;

forming a resin layer that covers the semiconductor element;

removing the support plate;

forming an opening in the resin layer; and forming an external connection terminal in the opening so that the external connection terminal is connected to an external connection pad of the wiring layer.

2. The method according to clause 1, further including connecting a first connection terminal to the external connection pad of the wiring layer before the forming a resin layer, wherein the forming a resin layer includes covering the semiconductor element and the first connection terminal by the resin layer, the forming an opening in the resin layer includes exposing the first connection terminal in the opening, and the forming an external connection terminal includes applying a conductive material to the first connection terminal so as to form the external connection terminal that projects beyond a surface of the resin layer.

3. The method according to clause 1, further including forming a resist layer covering the wiring layer, wherein the support plate includes a projection portion for forming a recessed portion extending through the insulation layer and the resist layer, the recessed portion exposes an edge portion of the insulation layer and an edge portion of the resist layer when the support plate is removed, the method further includes cutting the resin layer at the recessed portion to form a step at an edge portion of the semiconductor device, the step being formed by the edge portion of the insulation layer, the edge portion of the resist layer, and an edge portion of the resin layer.

The present examples and embodiments are to be considered as illustrative and not restrictive, and the invention is not to be limited to the details given herein, but may be modified within the scope and equivalence of the appended claims.

The invention claimed is:

1. A semiconductor device comprising:

a first insulation layer;

a wiring layer formed on a first surface of the first insulation layer, the wiring layer including an external connection pad formed on a first surface of the wiring layer and located at a position corresponding to a periphery of the first insulation layer, and an internal connection pad formed on the first surface of the wiring layer and located at an inner side of the external connection pad;

a resist layer covering the first surface of the wiring layer such that the wiring layer is located in a region between an inner edge of the resist layer and an outer edge of the first insulation layer, the resist layer including a first opening exposing an inner portion of the first surface of the wiring layer as the internal connection pad, and a second opening exposing an outer portion of the first surface of the wiring layer as the external connection pad;

a semiconductor element located facing the first surface of the first insulation layer, the semiconductor element including an electrode pad formed on a first surface of the semiconductor element facing the first surface of the first insulation layer and located at a position corresponding to the internal connection pad of the wiring layer, a bump formed on the electrode pad and connected to the internal connection pad, and a circuit element region defined in the first surface of the semiconductor element at an inner side of the electrode pad;

a second insulation layer filling a gap between the first surface of the semiconductor element and the first surface of the first insulation layer;

a third insulation layer covering a second surface of the semiconductor element and the second insulation layer, wherein the third insulation layer includes an opening at a position corresponding to the external connection pad, and the second surface of the semiconductor element is located at a side opposite to the first surface of the semiconductor element; and an external connection terminal connected to the external connection pad.

2. The semiconductor device according to claim 1, wherein the resist layer includes a first resist layer covering the first surface of the wiring layer, and a second resist layer covering a peripheral portion of the first resist layer, the first opening extends through the first resist layer, and the second opening extends through the first and second resist layers.

3. The semiconductor device according to claim 1, wherein the semiconductor element is a sensor chip and includes sensor elements formed in the circuit element region.

4. The semiconductor device according to claim 1, wherein the wiring layer is located in a region where the wiring layer is not overlapped with the circuit element region of the semiconductor element in a plan view.

5. The semiconductor device according to claim 1, wherein the external connection pad is located at an outer side of the semiconductor element in a plan view.

6. The semiconductor device according to claim 1, wherein the second insulation layer extends to a location between the external connection pad and the internal connection pad and covers a side surface of the semiconductor element.

7. The semiconductor device according to claim 1, wherein the first insulation layer includes a second surface that is located at a side opposite to the first surface of the first insulation layer, and the second surface of the first insulation layer forms an outermost surface of the semiconductor device.

8. The semiconductor device according to claim 1, wherein the second insulation layer is filled into a gap formed by the first surface of the semiconductor element, the first surface of the first insulation layer, and the resist layer.

* * * * *